(12) United States Patent
Christensen et al.

(10) Patent No.: US 8,105,940 B2
(45) Date of Patent: Jan. 31, 2012

(54) POWER DISTRIBUTION IN A VERTICALLY INTEGRATED CIRCUIT

(75) Inventors: Todd Alan Christensen, Rochester, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 12/703,365

(22) Filed: Feb. 10, 2010

(65) Prior Publication Data
US 2010/0140808 A1   Jun. 10, 2010

Related U.S. Application Data

(63) Continuation of application No. 11/928,181, filed on Oct. 30, 2007, now Pat. No. 7,727,887.

(51) Int. Cl.
| | |
|---|---|
| *H01L 21/4763* | (2006.01) |
| *H01L 23/48* | (2006.01) |
| *H01L 23/52* | (2006.01) |
| *H01L 29/40* | (2006.01) |
| *H01L 23/02* | (2006.01) |

(52) U.S. Cl. ............ 438/637; 438/667; 257/E21.597; 257/E21.641; 257/774; 257/686

(58) Field of Classification Search .......... 438/637, 438/667, 597, 674, 675, 404, 687, 678, 686; 257/774, 686, 698, 775, 777, E21.577, E21.578, 257/E21.585, E21.586, E21.597
See application file for complete search history.

(56) References Cited

U.S. PATENT DOCUMENTS

| | | | |
|---|---|---|---|
| 5,006,922 | A | 4/1991 | McShane et al. |
| 5,432,677 | A | 7/1995 | Mowatt et al. |
| 5,438,216 | A | 8/1995 | Juskey et al. |
| 5,691,041 | A | 11/1997 | Frankeny et al. |
| 5,998,292 | A | 12/1999 | Black et al. |
| 6,376,908 | B1 | 4/2002 | Gaku et al. |
| 6,448,174 | B1 | 9/2002 | Ramm |
| 6,492,244 | B1 | 12/2002 | Christensen et al. |
| 6,495,454 | B2 | 12/2002 | Livengood et al. |
| 6,690,086 | B2 | 2/2004 | James et al. |
| 6,737,755 | B1 | 5/2004 | McLellan et al. |
| 6,841,884 | B2 | 1/2005 | Shizuno |
| 6,936,536 | B2 | 8/2005 | Sinha |
| 6,977,441 | B2 | 12/2005 | Hashimoto |
| 7,087,988 | B2 | 8/2006 | Hosomi |
| 7,148,565 | B2 | 12/2006 | Kim et al. |
| 2003/0209809 | A1 | 11/2003 | Lasky et al. |
| 2004/0173894 | A1 | 9/2004 | Glenn et al. |
| 2004/0238850 | A1 | 12/2004 | Kusumoto |
| 2005/0153060 | A1 | 7/2005 | McCormack et al. |
| 2005/0266608 | A1 | 12/2005 | Ho et al. |
| 2007/0194426 | A1 | 8/2007 | Hsu |
| 2007/0249095 | A1 | 10/2007 | Song et al. |
| 2008/0128773 | A1 | 6/2008 | Moll et al. |
| 2008/0174976 | A1 | 7/2008 | Satoh et al. |
| 2008/0284037 | A1* | 11/2008 | Andry et al. .............. 257/774 |
| 2009/0008793 | A1 | 1/2009 | Pohl et al. |
| 2010/0264551 | A1* | 10/2010 | Farooq et al. .............. 257/777 |

* cited by examiner

*Primary Examiner* — Walter L Lindsay, Jr.
(74) *Attorney, Agent, or Firm* — Matthew C. Zehrer

(57) ABSTRACT

A first through via is electrically insulated from surrounding wafer substrate material. A second through via is not electrically insulated from the surrounding wafer substrate material. This configuration is advantageous when the non-insulated via serves as the path for either Vdd or GND. By not insulating the through via, a first supply voltage (Vdd or GND) is allowed to flow through the surrounding wafer substrate material thereby decreasing the resistance of the first supply voltage path.

20 Claims, 11 Drawing Sheets

Copper
Silicon
Polysilicon
Oxide/Insulator

POWER DISTRIBUTION IN A VERTICALLY INTEGRATED CIRCUIT

CROSS REFERENCE TO RELATED FILINGS

The present application is a continuation application of and claims benefit to application Ser. No. 11/928,181 entitled, Method for Improved Power Distribution in a Three Dimensional Vertical Integrated Circuit. The present application is also related to application Ser. No. 11/930,409 entitled, Apparatus for Improved Power Distribution in a Three Dimensional Vertical Integrated Circuit.

FIELD OF THE INVENTION

The present invention generally relates to a microelectronic device and a process of manufacturing the microelectronic device and, more specifically, relates to a method of forming at least one or more non-insulated through vias and forming at least one or more insulated through vias, wherein substantially all of the insulated through vias transfer a first supply voltage (e.g., Vdd or GND) between a first chip and a second chip and wherein substantially all of the insulated through vias transfer a second supply voltage (e.g., Vdd or GDN) between the first chip and the second chip. The though via structure being within a three dimensional (3D) vertically stacked microelectronic device.

DESCRIPTION OF THE RELATED ART

Integrated circuits (ICs) are the foundation of many electronic systems. Essentially, an IC includes a large number of transistors and other circuitry that is formed on a single semiconductor wafer or chip and is interconnected to carry out a desired function. Increasing complexity of ICs requires utilizing more and more linked transistors and other circuitry.

Many modern electronic systems are created through the use of a variety of different integrated circuits; each IC performing one or more specific functions. For example, computer systems include at least one microprocessor and a number of memory chips. Conventionally, each of these ICs is formed on a separate chip, packaged independently and interconnected on, for example, a printed circuit board (PCB).

As IC technology progresses, there is a growing desire for a "system on a chip" in which the functionality of all of the IC devices of the system are packaged together without a conventional PCB. Ideally, a computing system should be fabricated with all the necessary IC devices on a single chip. In practice, however, it is very difficult to implement a truly high-performance "system on a chip" because of vastly different fabrication processes and different manufacturing yields for the logic and memory circuits.

As a compromise, various "system modules" have been introduced that electrically connect and package integrated circuit (IC) devices which are fabricated on the same or on different semiconductor wafers. Initially, system modules have been created by simply stacking two chips, e.g., a logic chip and memory chip, one on top of the other in an arrangement commonly referred to as chip-on-chip structure. Subsequently, multi-chip module (MCM) technology has been utilized to place a number of chips on a common substrate to reduce the overall size and weight of the package, which directly translates into reduced system size.

Existing multi-chip module (MCM) technology is known to provide performance enhancements over single chip or stacked chip packaging approaches. For example, when several semiconductor chips are mounted and interconnected on a common substrate through very high density interconnects, higher silicon packaging density and shorter chip-to-chip interconnections can be achieved. In addition, low dielectric constant materials and higher wiring density can also be obtained which lead to the increased system speed and reliability, and the reduced weight, volume, power consumption and heat to be dissipated for the same level of performance. However, MCM approaches still suffer from additional problems, such as bulky package, wire length and wire bonding that gives rise to stray inductances that interfere with the operation of the system module.

An advanced three-dimensional (3D) chip-to-chip vertical stack technology has been proposed by researchers to realize the ideal high-performance "system on a chip". In contrast to the existing multi-chip module (MCM) technology which seeks to place multiple chips on a common substrate, 3-D wafer-to-wafer vertical stack technology seeks to achieve the long-awaited goal of vertically stacking many layers of active IC devices such as processors, programmable devices and memory devices inside a single chip to shorten average wire lengths, thereby reducing interconnect RC delay and increasing system performance.

SUMMARY OF THE INVENTION

The present invention is generally directed to an improved three-dimensional (3D) chip-to-chip vertical stack. More specifically the various embodiments of the present invention relate to an apparatus and method of forming at least two through vias within a three dimensional (3D) vertically stacked microelectronic device. A first through via is electrically insulated from surrounding wafer substrate material. A second through via is not electrically insulated from the surrounding wafer substrate material. This configuration is advantageous when the non-insulated via serves as the path for a voltage supply (e.g., GND or Vdd). By not insulating the through via, voltage supply current is allowed to flow through the surrounding wafer substrate material thereby decreasing the resistance of the voltage supply path. This and other features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

In this detailed description various embodiments of the present invention of an improved three-dimensional (3D) chip-to-chip vertical stack device are herein described.

Figure 1:
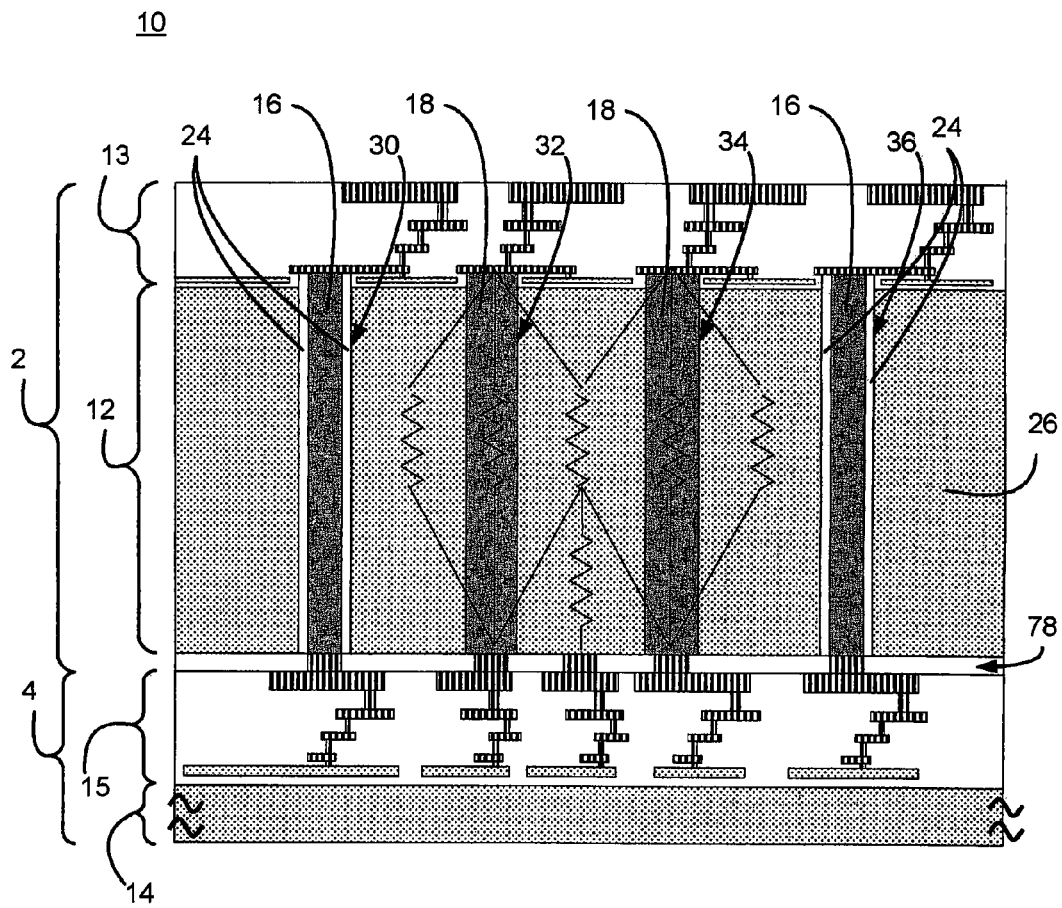
FIG. 1 depicts a microelectronic device, according to an embodiment of the present invention.

FIG. 1 depicts a microelectronic device 10. In a first embodiment microelectronic device 10 comprises a first wafer 2 comprising a substrate layer 12 having a wiring layer 13 thereupon. Substrate layer 12 has at least a hole 30 and at least a hole 32 extending through the substrate layer 12. Substrate layer 12 may be bulk silicon or any such equivalent material utilized to support a wiring layer in a wafer apparatus (i.e., an integrated circuit, etc.). Throughout the following detailed description reference is made to substrate layer 12, referring to the layer as a whole, or to substrate material 26, referring to a particular portion of the substrate layer 12. The hole 30 is defined by a wall 48 shown first in FIG. 5 and described further infra. The hole 32 is defined by a second wall 58 shown first in FIG. 7 and described further infra. 7.

Returning to FIG. 1, a insulating layer 24 covers the wall 48 of hole 30. Insulating layer 24 may take any such shape to cover wall 48 of hole 30. Insulating layer 24 is an insulating layer made from materials such as but not limited to oxide, silicon nitride, ceramic, etc. or any other such equivalent material. An insulated column 16 of electrically conductive material is formed within the insulating layer 24. A non-insulated column 18 of electrically conductive material is formed within the hole 32. In the present embodiment, insulated column 16 of electrically conductive material is electrically insulated from the substrate layer 12 and the non-insulated column 18 of electrically conductive material is not electrically insulated from the substrate layer 12. By not insulating the electrically conductive material of non-insulated column 18 from the surrounding substrate 12, the electric signals flowing through non-insulated column 18 may also flow through the substrate material 26 adjacently surrounding non-insulated column 18. This is advantageous when microelectronic device 10 is configured for a voltage supply (e.g., Vdd or GND) to flow through non-insulated column 18 and further configured for the opposite voltage supply or functional signals to flow through insulated column 16.

Figure 2:
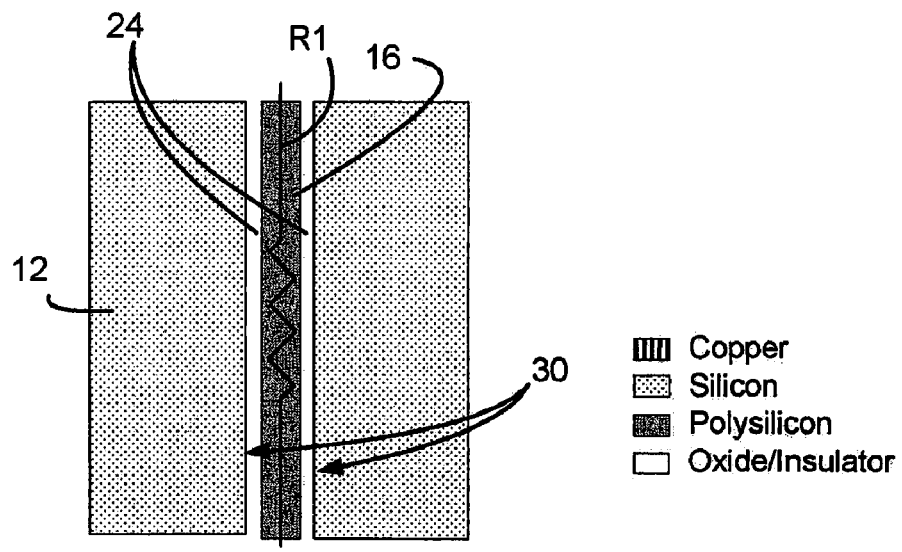
FIG. 2 depicts a detailed view of a particular feature(s) of the microelectronic device, according to an embodiment of the present invention.
Figure 3:
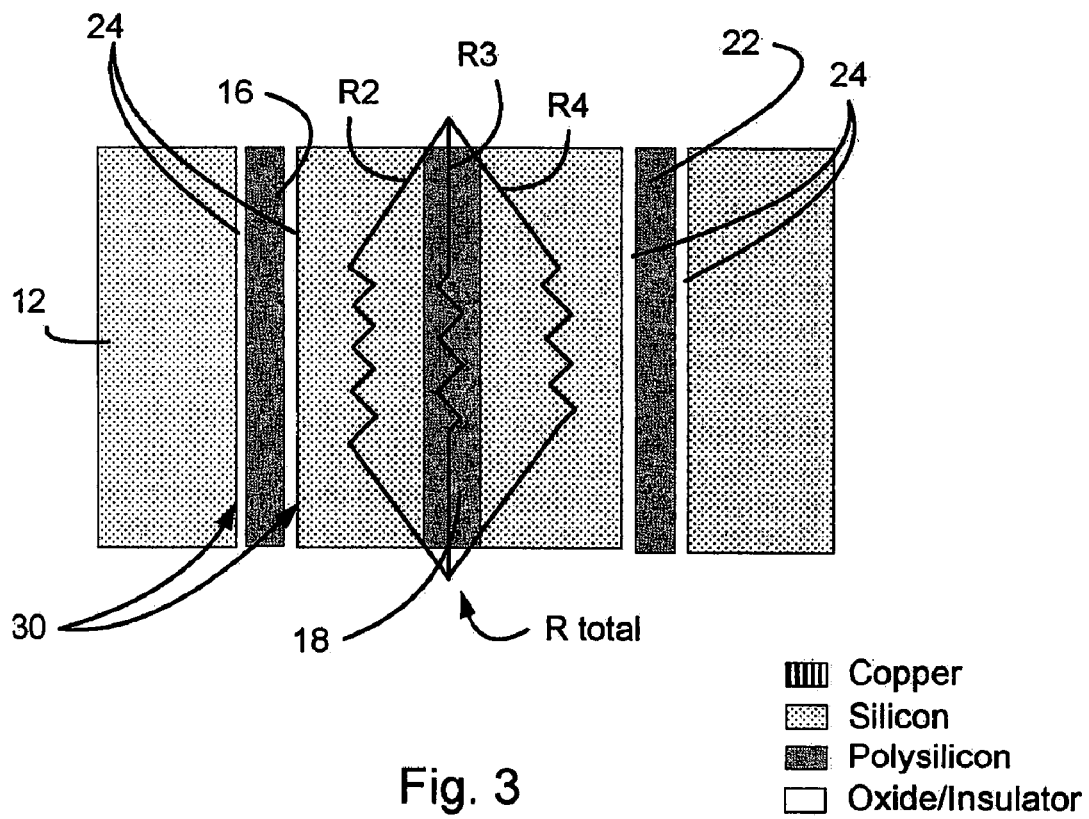
FIG. 3 depicts a detailed view of another particular feature(s) of the microelectronic device, according to an embodiment of the present invention.

For an explanation of these advantages, consider the following example illustrated on FIG. 2 and FIG. 3. Turning now to FIG. 2, an electrical resistance (R1) for an insulated via (e.g., insulated column 16 having the insulating layer 24 surrounding insulated column 16) is approximately 75 Ohms. In the present example the electrically conductive material (i.e., insulated column 16) of the via is polysilicon, having a resistivity of approximately 10 Ω$\mu$m. The via is 30 $\mu$m deep and has a 4 $\mu$m² area. The electrical resistance is therefore:

$$(10\,\Omega\mu m) \times \left(\frac{30\ \mu m}{4\ \mu m^2}\right) = 75\Omega.$$

Electrical resistance of a first supply voltage path may be reduced by connecting the first supply voltage to one or more non-insulated columns 18. A second voltage supply must use insulated columns 16. Therefore, alternatively microelectronic device 10 may be configured such that GND is allowed to flow through non-insulated column(s) 18. Only like supply voltages (i.e., GND or Vdd) should be allowed to flow through non-insulated via(s) 18.

Turning now to FIG. 3, an electrical resistance (Rtotal) though a non-insulated via (e.g., non-insulated column 18 sounded by substrate 12) and surrounding wafer material, is approximately 22 Ohms. The substrate 12 material is bulk silicon having a resistivity of approximately 100 Ω$\mu$m. The pitch of various adjacent non insulated vias is 10 $\mu$m (i.e., the adjacent vias are 10 $\mu$m apart from one another measured from the center of one via to the center of the adjacent via). Each via is 30 $\mu$m deep and has a 4 $\mu$m² area. In the present calculations a conservative estimation is made to demonstrate the effects of an unshielded via. In actuality the amount of current flowing through the substrate would diminish the further away from the unshielded via. The highest current flowing through the substrate is directly adjacent to the unshielded via. The lowest current flowing through the substrate is adjacent to the shielded via (in the situation where a shielded via is adjacent to the unshielded via). The following calculation assumes that a constant amount of current flows through the substrate, and also assumes that current only flows through half of the width of the subject substrate area. The resistance (Rtotal) is as follows: the area of resistance 10

μm, left to right on page, by 10 μm, into and out of the page, minus the area of non-insulated column 18 is 100 μm²−4 μm²=96 μm². Therefore the total surrounding resistance (R2, R4 in parallel) is $$(100\ \Omega\mu m) \times \left(\frac{30\ \mu m}{96\ \mu m^2}\right) = 31\Omega.$$

The total parallel resistance of R2+R4+R3 is $$\frac{75\Omega \times 31\Omega}{75\Omega + 31\Omega} = 22\Omega = R_{total}.$$

In an alternative embodiment shown in FIG. 1, a second wafer 4 comprises a substrate layer 14 having a wiring layer 15 thereupon. Within wiring layer 15 there comprises more than one electrical wiring paths. A first wiring path is configured to carry VDD. A second wiring path is configured to carry functional electrical signals or GND. The first wiring path is in electrical contact with non-insulated column 18. The second wiring path is in electrical contact with insulated column 16. In an alternative embodiment the via structure within substrate layer 12, described above, is replicated within substrate layer 14, thus creating a multi layered, vertically stacked chip-to-chip microelectronic device.

Figure 4:
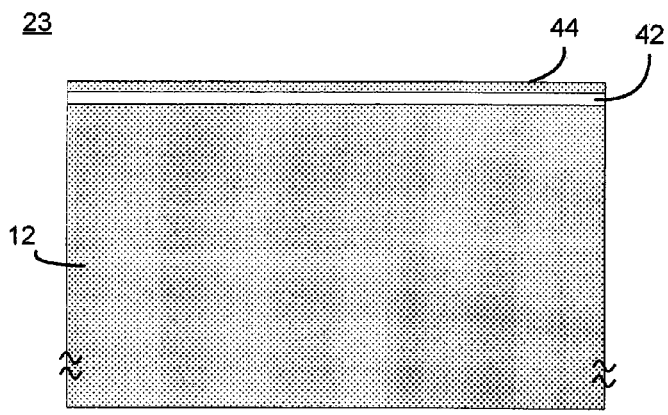
FIG. 4 is a figure depicting an embodiment of an exemplary process of forming the microelectronic device, and specifically depicts a starting bulk.

FIG. 4 is a figure depicting a first embodiment of an exemplary process of forming microelectronic device 10. FIG. 4 depicts a starting bulk 23. Bulk 23 comprises a substrate layer 12. In an alternative embodiment bulk 23 may also be in a form of silicon on insulator (SOI) wherein substrate layer 12 has an insulating layer 42 there upon and wherein an added layer of substrate 44 may be formed upon insulating layer 42. In the embodiment shown in FIG. 4 the substrate 12 is depicted as silicon. However any equivalent material may be utilized.

Figure 5:
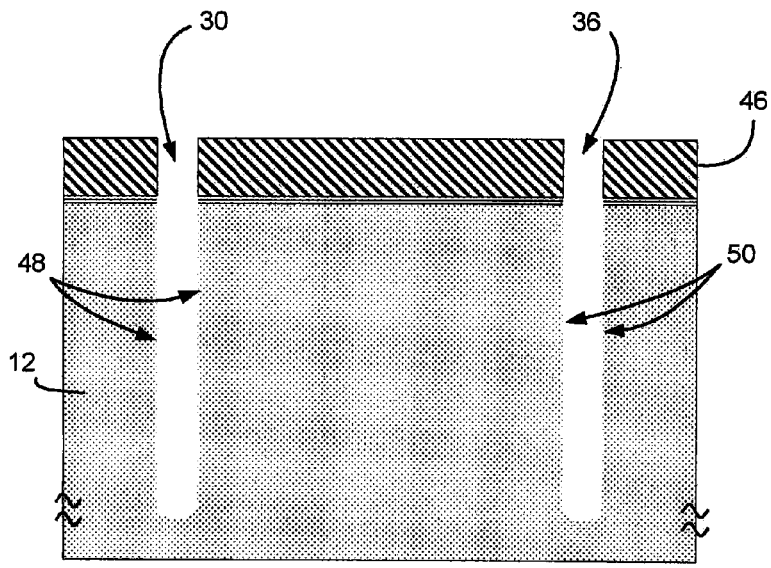
FIG. 5 is a figure depicting another embodiment of an exemplary process of forming the microelectronic device, and specifically depicts the formation of at least a first hole.

FIG. 5 is a figure depicting another embodiment of an exemplary process of forming microelectronic device 10. FIG. 5 depicts the formation of hole 30 and/or hole 36. Hole 30 and 36 are formed by etching techniques. Etching is used in microfabrication to chemically remove material from substrate 12. For many etch steps, part of the substrate is protected from an etchant by a "masking" material which resists etching. In this manner a masking layer 46 is applied/developed upon bulk 23. Masking layer 46 may be a photoresist layer (developed for example using photolithography), a silicon nitride layer, or any other such equivalent chemically developed layer, or any such equivalent mechanically applied layer. The masking layer may be a positive layer, in which the exposed areas become more sensitive to chemical etching and are removed in the developing process, or a negative layer, in which the exposed areas become resistant to chemical etching, so the unexposed areas are removed during the developing process. The depth of hole 30 and/or hole 36 may be controlled by varying a etching time and a known etch rate of the etchant. It is preferred to utilize anisotropic etches in forming holes 30 and/or 36 in order to produce sharp, well-controlled features (e.g., vertical side walls 48 and 50, etc.). The enchants utilized may be liquid-phase (wet) or plasma-phase (dry). After etching, hole 30 is defined by one or more wall(s) 48 and hole 36 is defined by one or more wall(s) 50.

Figure 6:
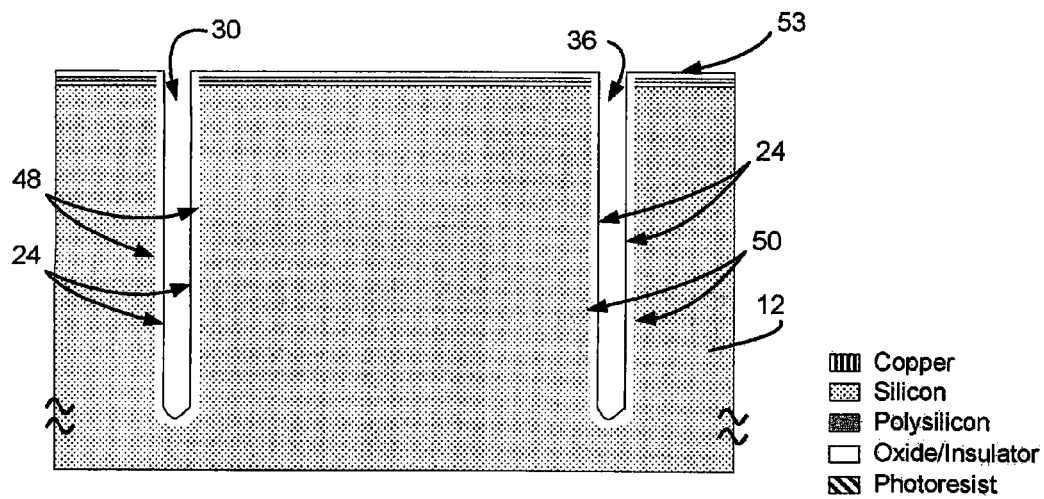
FIG. 6 is a figure depicting another embodiment of an exemplary process of forming the microelectronic device, and specifically depicts an electronic insulating layer deposited upon the bulk and within the first hole.

FIG. 6 is a figure depicting another embodiment of an exemplary process of forming microelectronic device 10. FIG. 6 depicts an electronic insulating layer 53 (herein referred to as insulating layer 53) applied or otherwise deposited upon bulk 23 after masking layer 46 is stripped or otherwise removed. The insulating layer 53 is applied/deposited atop bulk 23 and upon wall(s) 48 and wall(s) 50. The insulating layer 53 deposited upon wall(s) 48 and/or wall(s) 50 create insulating layer 24. Insulating layer 24 may take any geometrical shape to substantially cover wall(s) 48. Insulating layer 24 may take any geometrical shape to substantially cover wall(s) 50.

Figure 7:
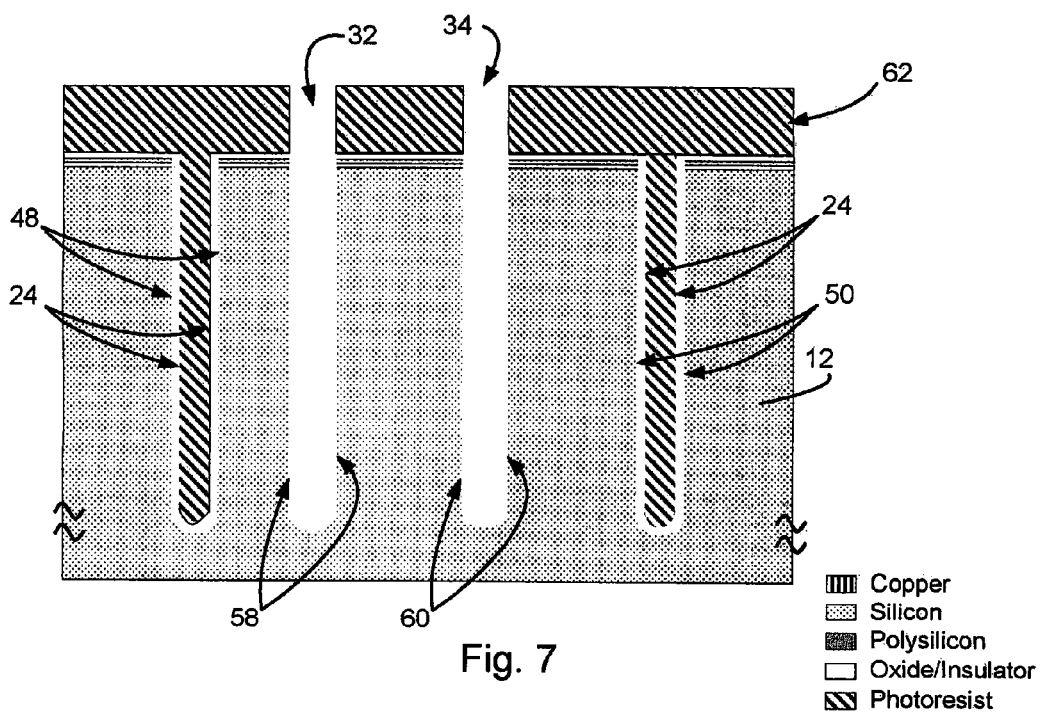
FIG. 7 is a figure depicting another embodiment of an exemplary process of forming the microelectronic device, and specifically depicts the formation of at least a second hole.

FIG. 7 is a figure depicting another embodiment of an exemplary process of forming microelectronic device 10. FIG. 7 depicts the formation of hole 32 and/or hole 34. Hole 32 and 34 are formed by similar etching techniques as described above. Masking layer 62 is applied/developed upon bulk 23 and within holes 30 and 36. Masking layer 62 may be a photoresist layer (developed for example using photolithography), a silicon nitride layer, or any other such equivalent chemically developed layer, or any such equivalent mechanically applied layer. The masking layer may be a positive layer, in which the exposed areas become more sensitive to chemical etching and are removed in the developing process, or a negative layer, in which the exposed areas become resistant to chemical etching, so the unexposed areas are removed during the developing process. The depth of hole 32 and/or hole 34 may be controlled approximately by varying a etching time and a known etch rate of the etchant. It is preferred to utilize anisotropic etches in forming holes 32 and/or 34 in order to produce sharp, well-controlled features (e.g., vertical side walls 58 and 60, etc.). The enchants utilized may be liquid-phase (wet) and plasma-phase (dry). After etching, hole 32 is defined by one or more wall(s) 58 and hole 34 is defined by one or more wall(s) 60.

Figure 8:
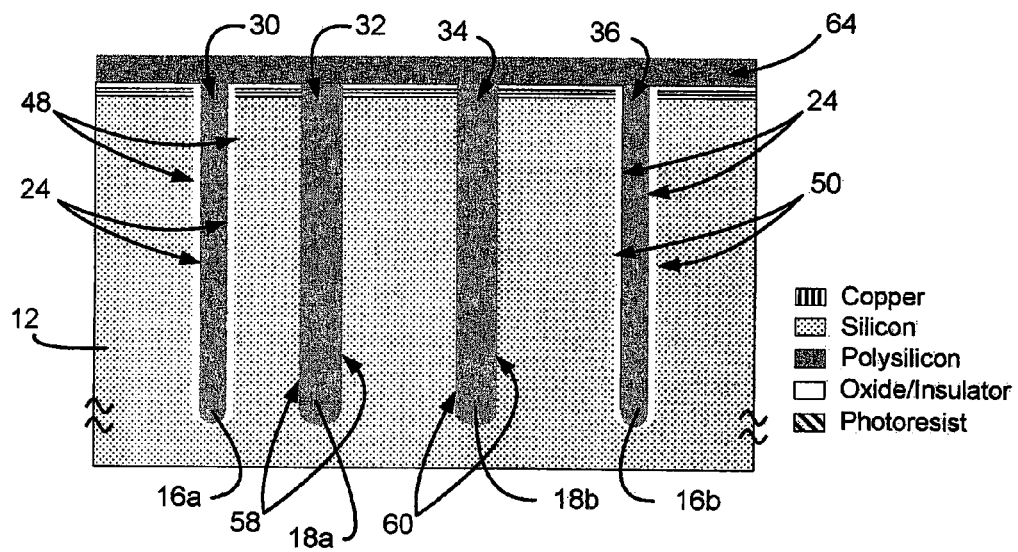
FIG. 8 is a figure depicting another embodiment of an exemplary process of forming the microelectronic device, and specifically depicts an electrically conductive material applied or otherwise deposited upon the bulk wafer and within the first hole and second hole.

FIG. 8 is a figure depicting another embodiment of an exemplary process of forming microelectronic device 10. FIG. 8 depicts electronic conductive material 64 (herein referred to as conductive layer 64) applied or otherwise deposited upon bulk 23 after masking layer 62 is stripped or otherwise removed. The conductive layer 64 is polysilicon, tungsten or any such equivalent electrically conductive material. The conductive layer 64 is applied/deposited atop bulk 23 (not enumerated in FIG. 8) and within holes 30, 32, 34, and 36. The conductive material within hole 30 and hole 36 is substantially surrounded by insulating layer 24 and insulating layer 24 respectively. The conductive material within hole 32 and hole 34 is substantially surrounded by substrate material 12. The conductive material within hole 30 creates insulated column 16a. The conductive material within hole 32 creates non-insulated column 18a. The conductive material within hole 34 creates non-insulated column 18b. The conductive material within hole 36 creates insulating column 16b. It is noted that the general numerical enumeration (i.e., insulated column 16) is used instead of a specific enumeration (i.e., insulated column 16a) when the description applies to all forms of the specific enumeration (i.e., insulated column 16a and insulated column 16b).

Figure 9:
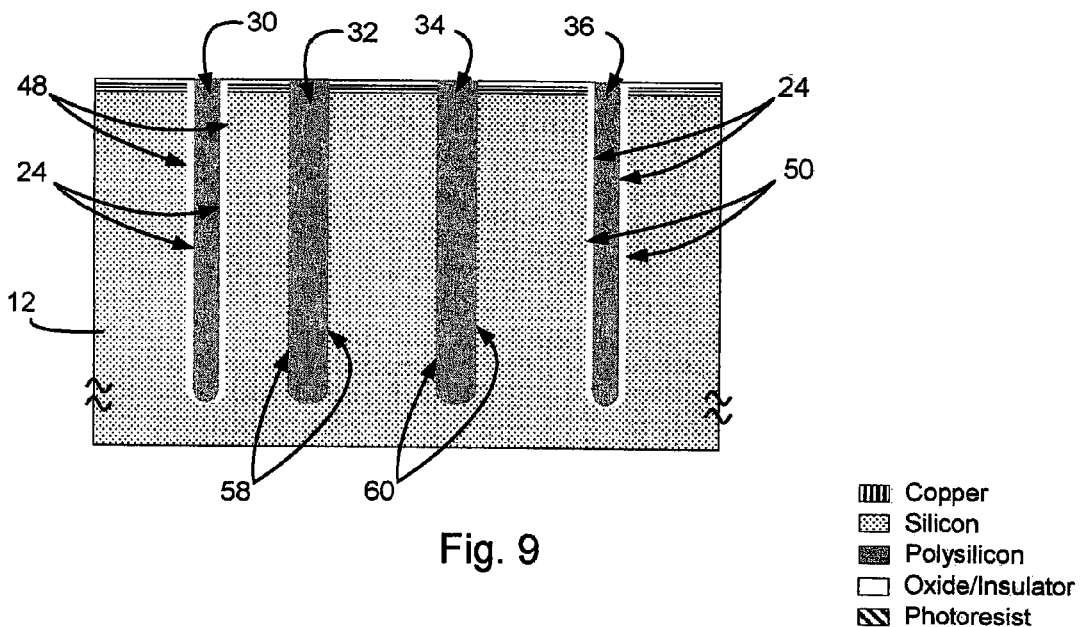
FIG. 9 is a figure depicting another embodiment of an exemplary process of forming the microelectronic device, and specifically depicts the electrically conductive material being polished or otherwise removed from atop the bulk wafer.

FIG. 9 is a figure depicting another embodiment of an exemplary process of forming microelectronic device 10. FIG. 9 depicts excess conductive material 64 being polished or otherwise removed from atop bulk 23 (not enumerated in FIG. 9). By removing excess conductive material 64 from atop bulk 23, bulk 23 is prepared for further Back End of Line (BEOL) or Front End of Line (FEOL) processing. FEOL denotes the first portion of integrated circuit fabrication where the individual devices (transistors, resistors, etc.) are patterned in the semiconductor. FEOL generally covers everything up to (but not including) the deposition of metal layers. BEOL denotes the portion of the integrated circuit fabrication where the active components (transistors, resistors, etc.) are interconnected with wiring on the wafer. BEOL generally begins when the first layer of metal is deposited on the wafer. It includes contacts, insulator, metal levels, and bonding sites for chip-to-package connections. Dicing the wafer into individual integrated circuit chips is also a BEOL process.

Figure 10:
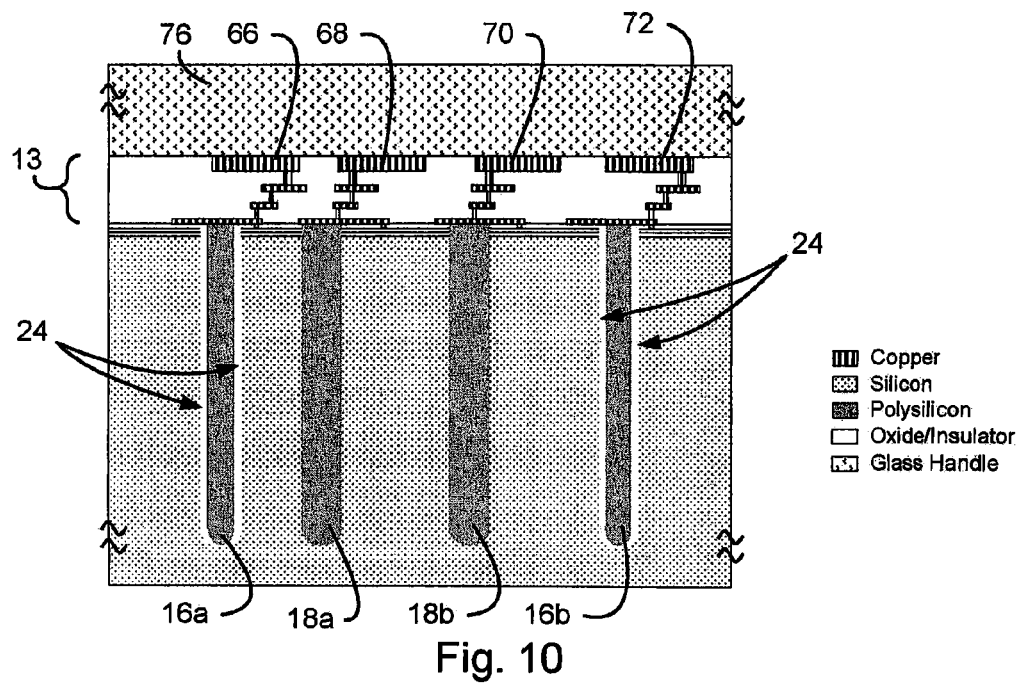
FIG. 10 is a figure depicting another embodiment of an exemplary process of forming the microelectronic device, and specifically depicts a wiring layer formed in the BEOL and/or FEOL processes upon the bulk wafer.

FIG. 10 is a figure depicting another embodiment of an exemplary process of forming microelectronic device 10. FIG. 10 depicts a wiring layer 13 formed in the BEOL processes upon bulk 23. Optionally glass handle layer 76 may be applied upon wiring layer 13. Wiring layer comprises at least wire series 66 and wire series 68, and may also comprise wire series 70, and wire series 72. Each wire series may carry various electrical signals, or supply voltage (e.g., GND or Vdd). Wire series 66 is in electrical contact with insulated column 16a. Wire series 68 is in electrical contact with non-insulated column 18a. Wire series 70 is in electrical contact with non-insulated column 18b. Wire series 72 is in electrical contact with insulating column 16b. Wire series 66 and/or 72 may be configured to be an electrical path(s) for GND or functional signals. Wire series 68 and/or 70 may be configured to be an electrical path(s) for Vdd. Wire series 66 and/or 72 may alternatively be configured to be an electrical path(s) for Vdd. Wire series 68 and/or 70 may alternatively be configured to be an electrical path(s) for GND or other functional signals. Insulating layer 24 insulates the voltage supply (e.g., GND or Vdd) or functional signals transferred by insulated column 16 from the substrate material 26 surrounding insulated column 16. It is noted that the general numerical enumeration (i.e., insulated column 16) is used instead of a specific enumeration (i.e., insulated column 16a) when the description applies to all forms of the specific enumeration (i.e., insulated column 16a and insulated column 16b).

Figure 11:
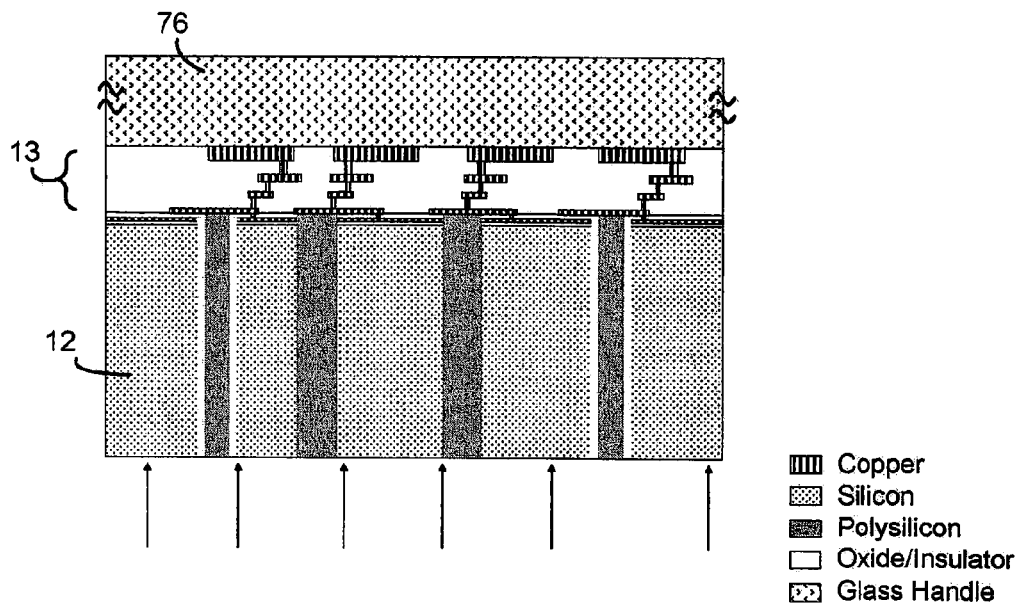
FIG. 11 is a figure depicting another embodiment of an exemplary process of forming the microelectronic device, and specifically depicts the polishing of the backside of the bulk wafer.

FIG. 11 is a figure depicting another embodiment of an exemplary process of forming microelectronic device 10. FIG. 11 depicts the polishing of the backside of bulk 23. The glass handle 76 serves as a mechanical stiffener to provide adequate mechanical strength to bulk 23 for the polishing. In a embodiment the backside of bulk 23 is polished such that columns 16, 18, 20, and 22 extend through the entire substrate layer 12.

Figure 12:
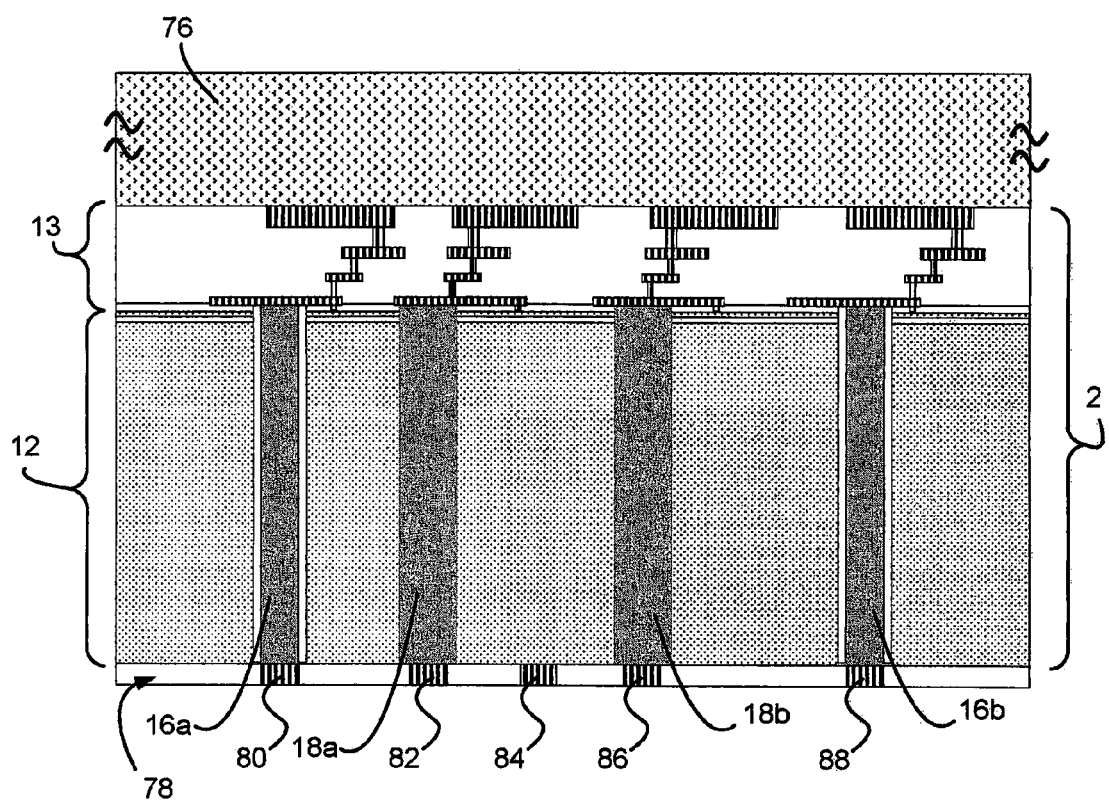
FIG. 12 is a figure depicting another embodiment of an exemplary process of forming the microelectronic device, and specifically depicts an optional step of applying a backside bonding layer upon the backside of the bulk wafer.

FIG. 12 is a figure depicting another embodiment of an exemplary process of forming microelectronic device 10. FIG. 12 depicts an optional step of applying backside bonding layer 78 upon bulk 23. Backside bonding layer comprises at least electrically conductive pad 80 and pad 82. Backside bonding layer may also comprise pad 84, pad 86, and pad 88. Electrically conductive pads 80, 82, 84, 86, and 88 are electrically conductive and serve to electrically couple columns 16, 18, and possibly wafer material 26 to a second wafer 4 (not shown in FIG. 12). In a embodiment electrically conductive pads 80, 82, 84, 86, and 88 are copper, however in other embodiment electrically conductive pads 80, 82, 84, 86, and 88 may be made of any other equivalent material. Electrically conductive pads 80, 82, 84, 86, and 88 are each separated from adjacent pads by an insulating material. Electrically conductive pad 80 is in electrical contact with insulated column 16a. Electrically conductive pad 82 is in electrical contact with non-insulated column 18a. Electrically conductive pad 86 is in electrical contact with non-insulated column 18b. Electrically conductive pad 88 is in electrical contact with insulating column 16b. Electrically conductive pad 84 is in electrical conduct with the substrate material 26 in between non-insulated column 18a and non-insulated column 18b. It is noted that the general numerical enumeration (i.e., insulated column 16) is used instead of a specific enumeration (i.e., insulated column 16a) when the description applies to all forms of the specific enumeration (i.e., insulated column 16a and insulated column 16b).

Figure 13:
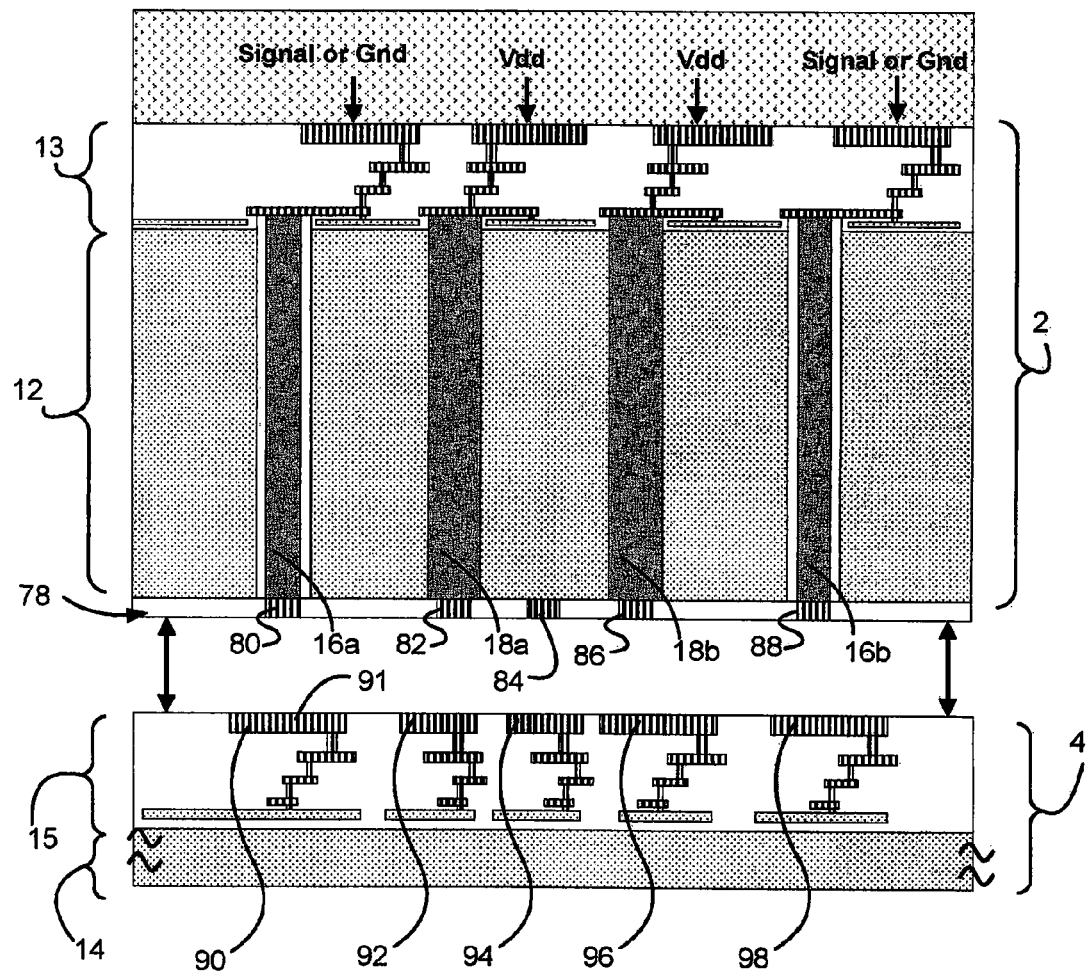
FIG. 13 is a figure depicting another embodiment of an exemplary process of forming the microelectronic device, and specifically depicts the addition (i.e., bonding, etc.) of a second wafer to the first wafer.

FIG. 13 is a figure depicting another embodiment of an exemplary process of forming microelectronic device 10. FIG. 13 depicts the addition of a second wafer 4 to the first wafer 2, or the process step of bonding wafer 4 to wafer 2. Wafer 4 comprises a wiring layer 15 and a substrate layer 14. Wiring layer 15 comprises at least wire series 90 and wire series 92, and may also comprise wire series 96, and wire series 98. Optionally wiring layer 15 may also comprise wiring series 94. Each wire series may be configured to carry various electrical signals, or supply voltage (GND or Vdd). Wire series 90 is in electrical contact with insulated column 16a. Wire series 92 is in electrical contact with non-insulated column 18a. Wire series 96 is in electrical contact with non-insulated column 18b. Wire series 98 is in electrical contact with insulating column 16b. Wire series 94 is in electrical contact with the wafer material 26 located between non-insulated column 18a and non-insulated column 18b. In another embodiment wire series 90 is in electrical contact with conductive pad 80, wire series 92 is in electrical contact with conductive pad 82, wire series 94 is in electrical contact with conductive pad 84, wire series 96 is in electrical contact with conductive pad 86, and wire series 98 is in electrical contact with conductive pad 88. In a specific example, wire series 90 and 98 is an electrical path(s) for GND or functional signals. Wire series 92, 94, and 96 is an electrical path(s) for Vdd. Alternatively however, wire series 90 and 98 is an electrical path(s) for Vdd. Wire series 92, 94, and 96 is an electrical path(s) for GND. In another embodiment each wire series comprises an exposed wire section that is substantially on a similar plane as the top side of wafer 4. For example wire series 90 comprises a wire section 91. In this embodiment wire section 91 has a finite width (left to right on page, as shown in FIG. 13). In a embodiment the center of the particular width of wire section 91 is substantially coincident with a center axis of insulated column 16 and/or a center axis of conductive pad 80. It is noted that the general numerical enumeration (i.e., insulated column 16) is used instead of a specific enumeration (i.e., insulated column 16a) when the description applies to all forms of the specific enumeration (i.e., insulated column 16a and insulated column 16b).

Figure 14:
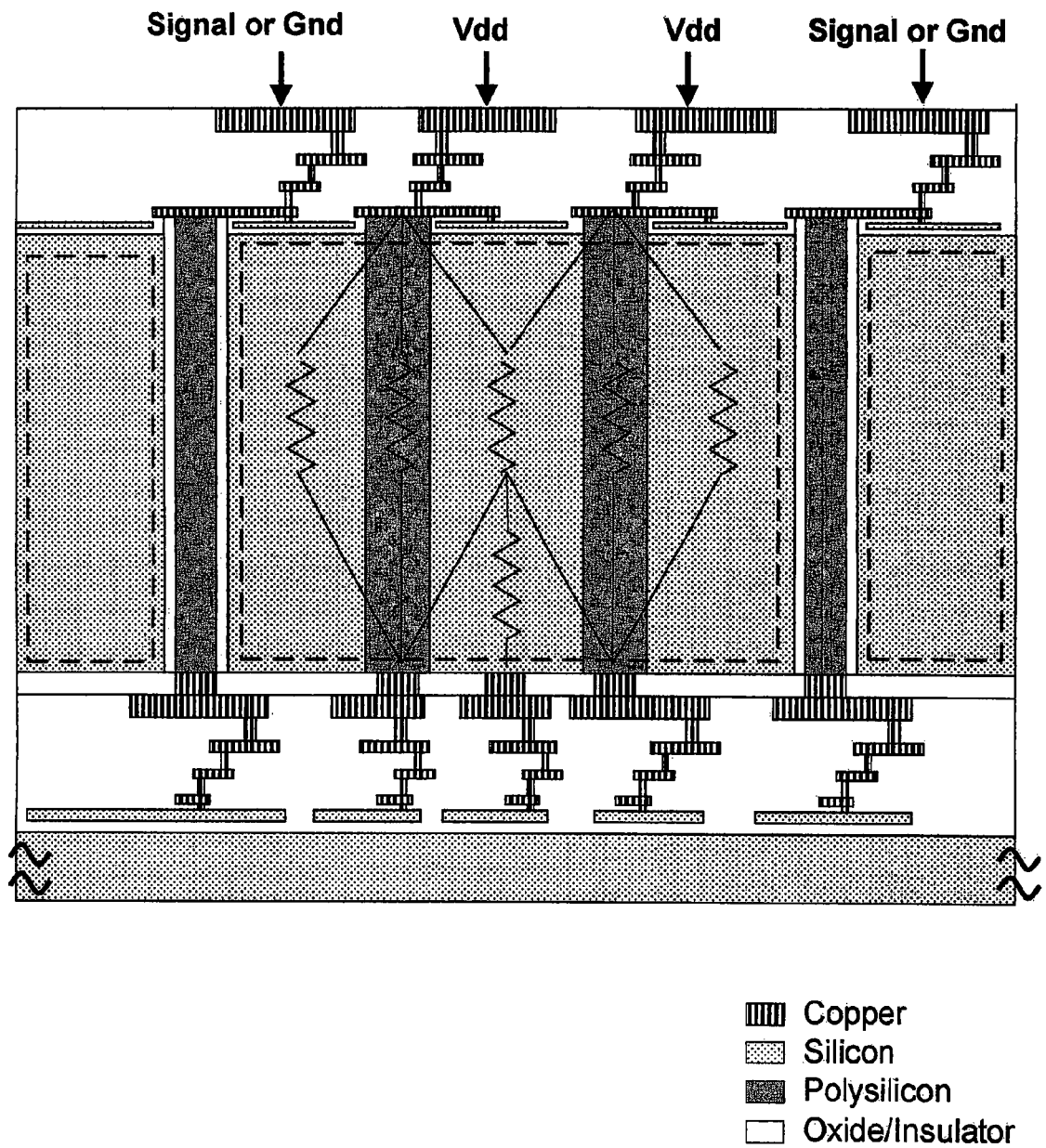
FIG. 14 is a figure depicting the microelectronic device, and specifically depicts the particular locations, specifically within the dashed lines, that are electrically connected to Vdd according to an embodiment of the present invention.

FIG. 14 is a figure depicting the final microelectronic device 10. FIG. 14 depicts the particular locations, specifically within the dashed lines, that are electrically connected to a specific supply voltage (depicted specifically in FIG. 14 as Vdd, but alternatively may be GND). This solution presenting in FIG. 14 provides an improved resistance path for Vdd distribution.

Figure 15:
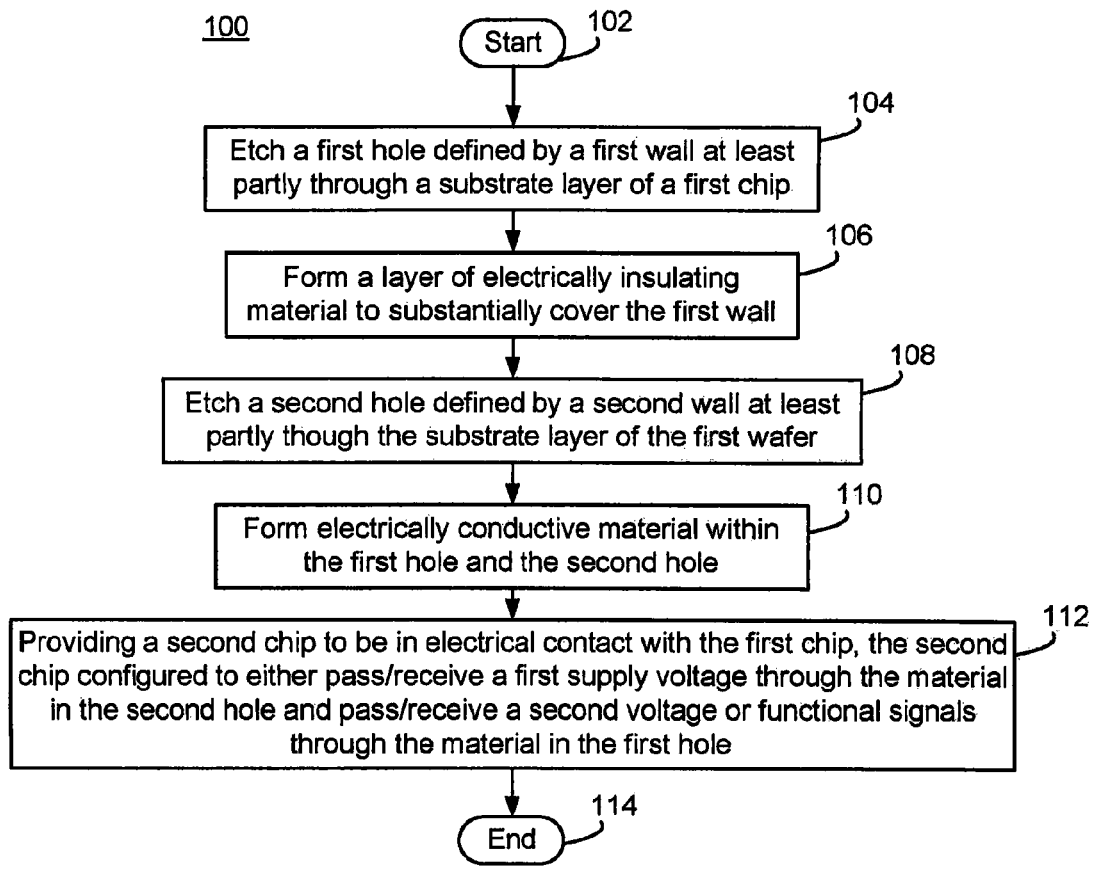
FIG. 15 is a figure depicting a method of manufacture for the microelectronic device according to an embodiment of the present invention.

FIG. 15 is a figure depicting a method 100 of manufacture for the microelectronic device according to an embodiment of the present invention. Method 100 starts at block 102. Block 104 describes the step of etching a first hole being defined by a first wall at least partly though a substrate layer of a first wafer. Electrically insulating material is applied or otherwise deposited upon the first wafer to substantially cover the first wall (block 106). A second hole is etched at least partly though the substrate layer, the second hole being defined by a second wall (block 108). An electrically conductive material is then applied or otherwise deposited in order to substantially fill the first hole and the second hole (block 110). A second wafer to provide to be in electrical contact with the first wafer (block 112). The second wafer may be configured to either pass or receive VDD through the electrically conductive material in the second hole. The second wafer may also be configured to either pass or receive GND or functional signals through the electrically conductive material in the first hole. Method 100 ends at block 114.

Figure 16:
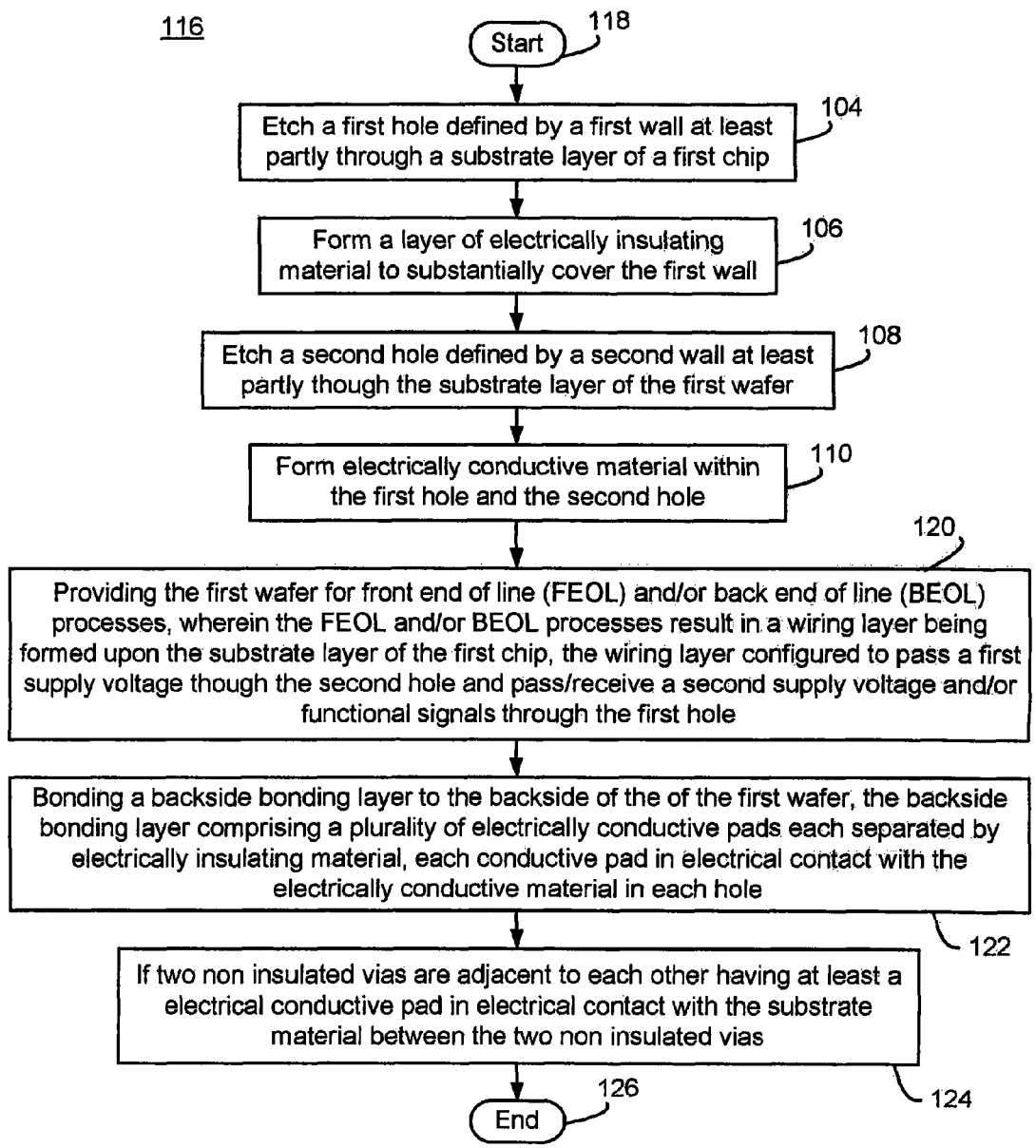
FIG. 16 is a figure depicting an alternative method of manufacture for the microelectronic device according to an embodiment of the present invention.

FIG. 16 is a figure depicting an alternative method 116 of manufacture for the microelectronic device according to an embodiment of the present invention. Method 116 starts at block 118. Block 104 describes the step of etching a first hole being defined by a first wall at least partly though a substrate layer of a first wafer. Electrically insulating material is applied or otherwise deposited upon the first wafer to substantially cover the first wall (block 106). A second hole is etched at least partly though the substrate layer, the second hole being defined by a second wall (block 108). An electrically conductive material is then applied or otherwise deposited in order to substantially fill the first hole and the second hole (block 110). The first wafer is provided to undergo FEOL and/or BEOL processes. The processes may result in a wiring layer being formed upon the substrate layer of the first wafer (block 120). The wiring layer is configured to pass Vdd through the substrate layer utilizing the electrically conductive material in the second hole (non-insulated via) and is further configured to pass GND or functional signals through the substrate layer utilizing the electrically conductive material in the first hole (insulated via). A bonding layer is applied to the backside of the first wafer (block 122). The bonding layer comprises a plurality of electrically conductive pads each separated by electrically insulting material. The electrically conductive pads are configured to be in electrical contact with the electrically conductive material in each hole. If two non insulated vias are adjacent to each other, an electrically conductive pad is arranged such that that particular pad is in electric contact with the substrate material between the two non insulated vias (block 124). Method 116 ends at block 126.

The accompanying figures and this description depicted and described embodiments of the present invention, and features and components thereof. Those skilled in the art will appreciate that any particular nomenclature used in this description was merely for convenience, and thus the invention should not be limited to use solely in any specific application identified and/or implied by such nomenclature. Therefore, it is desired that the embodiments described herein be considered in all respects as illustrative, not restrictive, and that reference be made to the appended claims for determining the scope of the invention.

The invention claimed is:

1. A method of manufacture for a microelectronic device comprising:
   providing a first wafer comprising a non-insulated via surrounded by substrate material; and
   providing for a first voltage to be transferred from the first wafer to a second wafer through the non-insulated via and the substrate material.

2. The method of claim 1 wherein the first wafer also comprises an insulated via.

3. The method of claim 2 wherein the insulated via is electrically insulated from the substrate material and the non-insulated via is not electrically insulated from the substrate material.

4. The method of claim 2 further comprising:
   providing for a second voltage to be transferred from the first wafer to the second wafer through the insulated via.

5. The method of claim 4 wherein the first voltage is Vdd and the second voltage is GND or is a signal voltage.

6. The method of claim 1 further comprising:
   providing the first wafer for front end of line (FEOL) and/or back end of line (BEOL) processes.

7. The method of claim 1 further comprising:
   providing an intermediate bonding layer between the first wafer and the second wafer.

8. The method of claim 1 wherein providing for a first voltage to be transferred from the first wafer to a second wafer through the non-insulated via and the substrate material further comprises:
   providing a wiring layer used for transferring electrical current.

9. The method of claim 1 wherein the first wafer is stacked vertically upon the second wafer.

10. An electronic device comprising:
    a non-insulated via within a substrate layer of a first wafer that provides an electrical connection to a second wafer where a first voltage may be provided through the non-insulated via and through the substrate layer surrounding the non-insulated via.

11. The electronic device of claim 10 wherein the first wafer also comprises an insulated via.

12. The electronic device of claim 11 wherein the insulated via is electrically insulated from the substrate layer and the non-insulated via is not electrically insulated from the substrate layer.

13. The electronic device of claim 11 wherein the insulated via also provides an electrical connection to the second wafer where a second voltage may be provided through the insulated via.

14. The electronic device of claim 13 wherein the first voltage is Vdd and the second supply voltage is GND or is a signal voltage.

15. The electronic device of claim 10 further comprising:
    an intermediate bonding layer between the first wafer and the second wafer.

16. The electronic device of claim 15 wherein the first wafer further comprises
    a first wiring layer for transferring electrical current.

17. The electronic device of claim 16 wherein the second wafer further comprises a second wiring layer for transferring electrical current.

18. The electronic device of claim 17 wherein the first wiring layer is electrically connected to the non-insulated via and to the insulated via, the intermediate bonding layer is electrically connected to the non-insulated via and to the insulated via, and the second wiring layer is electrically connected to the non-insulated via and to the insulated via.

19. The electronic device of claim 10 wherein the first wafer is stacked vertically upon the second wafer.

20. The electronic device of claim 10 where the second wafer is stacked vertically upon the first wafer.

* * * * *